United States Patent [19]

Jahani

[11] 4,404,079

[45] Sep. 13, 1983

[54] PLATING MASK SUPPORT

[75] Inventor: Hooshang Jahani, San Jose, Calif.

[73] Assignee: National Semiconductor Corporation, Santa Clara, Calif.

[21] Appl. No.: 346,686

[22] Filed: Feb. 8, 1982

[51] Int. Cl.³ .............................................. C25D 17/00
[52] U.S. Cl. ................................ 204/224 R; 427/282; 204/15; 204/206; 204/279
[58] Field of Search ................... 204/224 R, 206, 279, 204/15; 427/282, 259; 101/405, 368

[56] References Cited

U.S. PATENT DOCUMENTS 2,753,298  7/1956  Gray ............................... 204/224 R
3,723,283  3/1973  Johnson et al. ..................... 204/206
3,954,570  5/1976  Shirk et al. ........................ 427/282
4,126,533  11/1978 Lukyanchikov et al. ...... 204/224 R
4,294,681  10/1981 Lincoln et al. ................. 204/224 R Primary Examiner—T. Tung
Assistant Examiner—Nathan S. Thane
Attorney, Agent, or Firm—Paul J. Winters; Michael J. Pollock; Gail W. Woodward

[57] ABSTRACT

An electroplating mask support structure of particular use in the plating of semiconductor chip lead frames in which a support bar has a number of support stations thereon with masking die containing cavities in the stations.

3 Claims, 3 Drawing Figures

PLATING MASK SUPPORT

BACKGROUND OF THE INVENTION

The invention relates to the art of electroplating certain specific areas of a continuous web of material. One example of such a material would be the lead frames upon which semiconductor chips are mounted for support and electrical connections. These lead frames are formed from a continuous web of metal which is plated in several different locations with precious metals by a plating machine such as described in U.S. Pat. No. 3,723,283. At each plating station, the web is clamped between masks that have apertures therein positioned to admit plating electrolyte only to desired areas. The masks typically cover enough of the web to simultaneously plate a number of discreet sets of chip pads. If for example, a spot is to be masked off on each set, a single support bar is used with a number of spaced projections, each of which has a small rubber like mask, in the shape of the spot to be protected, molded onto the surface of the projection. The bar is moved against the web so that each small rubber like mask contacts the correct portion of the web, and then plating is initiated.

In the prior art, the tiny spots to be protected must be positioned very accurately. Hence, a carefully machined metal bar is needed to define the exact locations. Each tiny mask is glued or molded directly to a projection on the bar so that it too will be in the exact right spot and of the exact shape and size. If just one of the fragile mask is damaged, the whole bar must be removed so that the damaged mask can be repaired. Considerable time is lost on the production line due to such repairs. My invention avoids this.

SUMMARY OF THE INVENTION

Briefly, a support bar is provided with a number of support stations instead of projections. Each station includes a cavity or hole shaped to match the area to be protected. Each hole contains a removable, rubber like, masking die that will contact and protect the web when the support bar is moved against the web. Since the masking die is physically supported it does not have to be a material suitable for molding or gluing. Thus, a harder, more carefully dimensioned die may be manufactured. Also, if one die is damaged, it may be easily extracted and replaced with little time lost. The support need not be removed for repair.

DESCRIPTION OF THE PREFERRED EMBODIMENT

Figure 1:
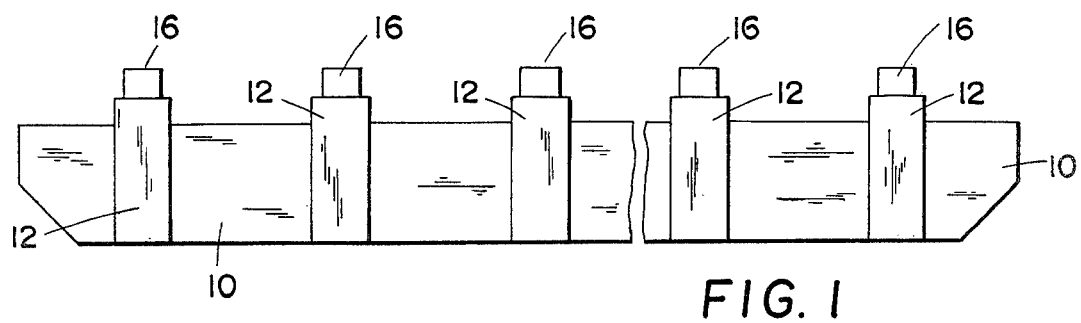
FIG. 1 is an elevational view of the support bar with masking dies mounted in the support stations.
Figure 2:
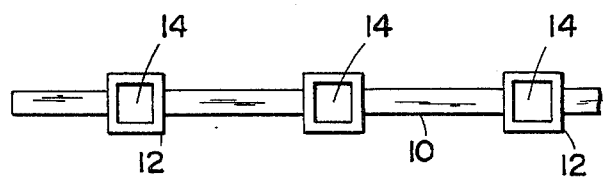
FIG. 2 is a top view of the left hand portion of the structure in FIG. 1.

In FIG. 1, a support bar 10 is shown having a plurality of similar support stations 12 thereon. Each station 12 has a cavity 14, best seen in FIG. 2 where the dies are omitted from the drawing. Each cavity 14 would, during normal operation, have a small rubber like masking die 16 inserted therein.

Figure 3:
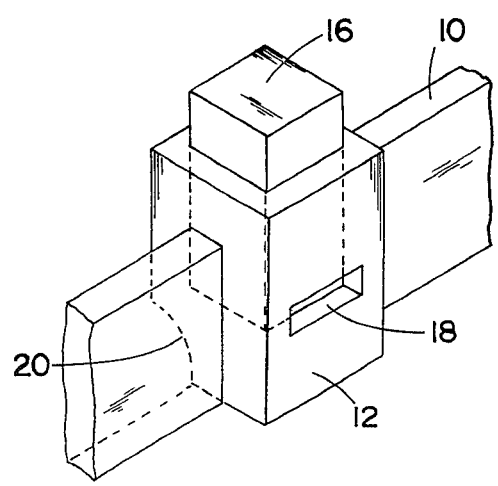
FIG. 3 is a perspective fragmentary view showing one of the support stations.

In FIG. 3 it may be seen that support stations 12 have small air pressure relief holes 18 which allow easier insertion of dies 16 into cavities 14. The shape of die 16 is chosen to be the same as the areas to be masked, square in the drawings. Cavity 14 is also square. However, the shape of the cavity need not necessarily be the same as the web contacting top of the die. If desired, support stations 12 can be tapered as at 20.

With this invention, if one of the dies is damaged, it may be extracted from cavity 14, turned over, and reinserted to permit use of both ends of die 16. Hence, the commonality of shapes is advantageous. When die 16 is worn out, one still need not remove bar 10, but only the worn die which takes but seconds. Also die 16 may be manufactured separately from bar 10 and thus may be of material optimized for dimensional stability, hardness, flexibility, strength, and shape.

I claim:

1. In combination with a plating system for plating selected portions of a web of material, a masking apparatus comprising:
    a support member;
    a plurality of support stations on said member at locations aligned with selected areas on the web of material, which areas are to be protected from plating solution;
    a die supporting cavity in each of said support stations; and
    masking dies shaped to be removably insertable in said cavities.
2. The apparatus of claim 1, including an air pressure relief hole in said cavities.
3. The apparatus of claim 1 in which said cavity and said die are both shaped to match the area to be protected.

* * * * *